United States Patent

Oshima et al.

[11] Patent Number: 5,933,466
[45] Date of Patent: Aug. 3, 1999

[54] RADIO COMMUNICATIONS APPARATUS WITH A COMBINING DIVERSITY

[75] Inventors: Shoichi Oshima, Ome; Manabu Ishibe, Hachioji, both of Japan

[73] Assignee: Kabushiki Kaisha Toshiba, Kawasaki, Japan

[21] Appl. No.: 08/808,027

[22] Filed: Mar. 3, 1997

[30] Foreign Application Priority Data

Mar. 5, 1996 [JP] Japan .................................. 8-047478

[51] Int. Cl.⁶ .............................. H04L 1/02; H04B 17/02; H04B 1/06
[52] U.S. Cl. .......................... 375/347; 455/137; 455/273
[58] Field of Search .................................. 375/347, 267, 375/349, 344, 345; 455/137, 138, 140, 273, 276.1; 343/712

[56] References Cited

U.S. PATENT DOCUMENTS

| | | |
|---|---|---|
| 4,850,037 | 7/1989 | Bochmann . |
| 5,140,615 | 8/1992 | Jasper et al. .............................. 375/347 |
| 5,490,180 | 2/1996 | Muto ....................................... 375/347 |
| 5,550,872 | 8/1996 | Liberti, Jr. et al. ...................... 375/347 |

FOREIGN PATENT DOCUMENTS

| | | |
|---|---|---|
| 687 076 A2 | 12/1995 | European Pat. Off. . |
| 6-268559 | 9/1994 | Japan . |
| 7-154 377 | 6/1995 | Japan . |
| WO 96/13102 | 5/1996 | WIPO . |

Primary Examiner—Don N. Vo
Assistant Examiner—Albert C. Park
Attorney, Agent, or Firm—Finnegan, Henderson, Farabow, Garrett & Dunner, L.L.P.

[57] ABSTRACT

The present invention is directed to a radio communications apparatus with combining diversity in which received radio signals are weighted appropriately to reduce an error in demodulation and improve in communication quality. In the signal combining diversity radio communications apparatus, the digital reception signals of an intermediate frequency, output from the reception circuit, are demodulated by demodulation circuits into digital demodulation signals of the baseband. The digital demodulation signals are input to the multiplication circuits. The multiplication circuits multiply the digital demodulation signals by the weight coefficients, which are generated by weight coefficient generation circuits and corresponding to the digital demodulation signals, based on C/N ratio detection signals, in order to weight the digital demodulation signals. The weighted demodulation signals are added together by a digital addition circuit. Consequently, the received signals can be weighted appropriately to thereby improve in communication quality.

19 Claims, 6 Drawing Sheets

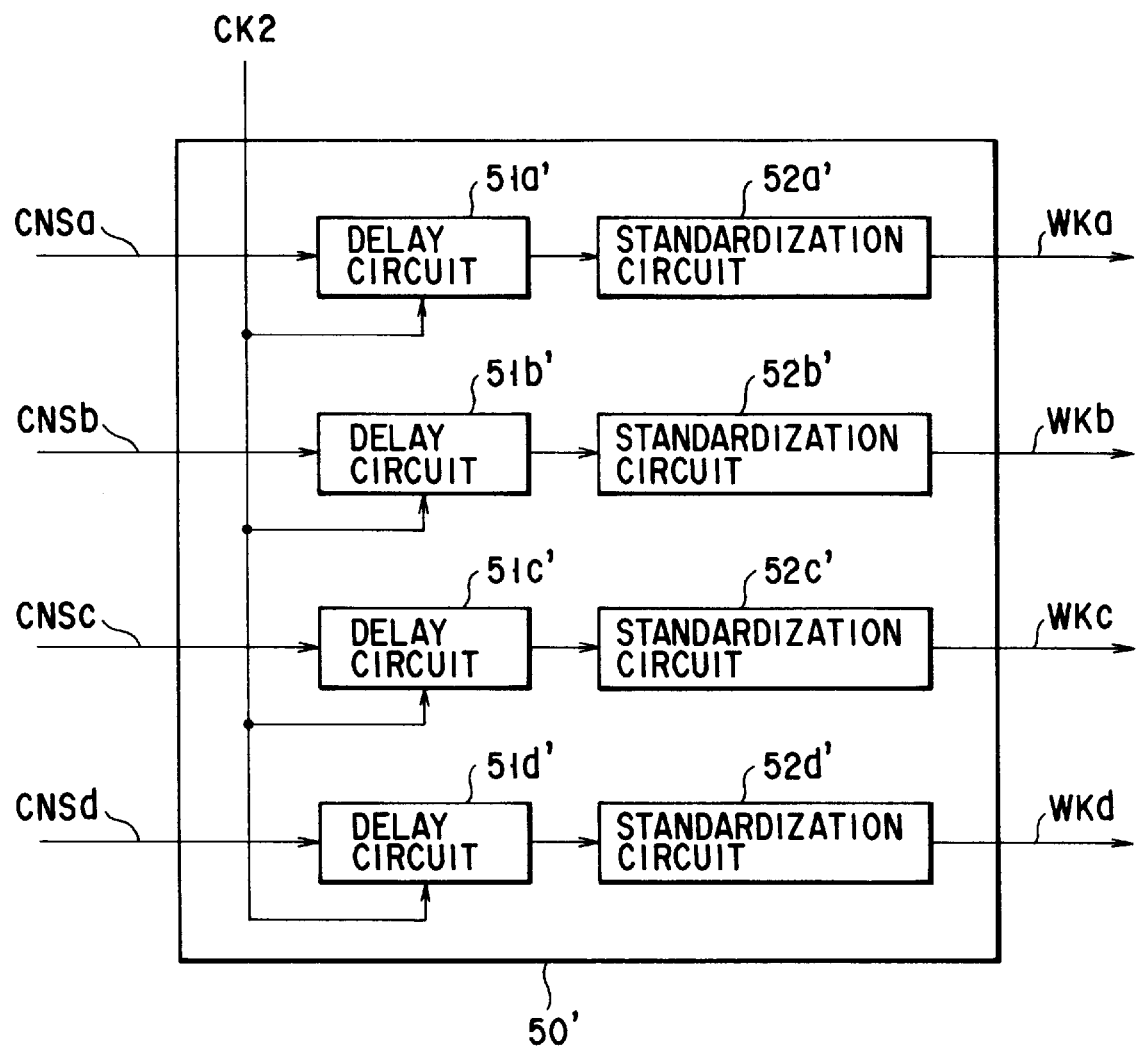
F I G. 6

RADIO COMMUNICATIONS APPARATUS WITH A COMBINING DIVERSITY

BACKGROUND OF THE INVENTION

The present invention relates to a radio communications apparatus for use in a mobile communications system such as a car telephone system and a PHS (personal handyphone system) and, more particularly, to a radio communications apparatus with a combining diversity.

In general, a mobile communication system employs a diversity reception system in order to reduce an influence of fading. For example, a base station of the PHS comprises a plurality of antennas separated from one another, and radio signals received by these antennas are weighted by a weight coefficient set in accordance with their electric field strengths and then combined together. This combined signal is demodulated and then decoded by a CODEC.

FIG. 1 is a block diagram of the arrangement of a radio circuit of a conventional PHS base station.

As illustrated in FIG. 1, radio signals transmitted from a PHS mobile station (not shown), are received by four antennas $1a$ to $1d$ and supplied to frequency converters $2a$ to $2d$, respectively. In these frequency converters, the signals are mixed with local oscillation signals generated from local oscillators (LO) $3a$ to $3d$ to down-convert them to signals having an intermediate frequency and then to supply the signals to operational amplifiers $4a$ to $4d$ for weighting.

The radio signals received by the antennas $1a$ to $1d$ are inputted to received signal strength indicators (RSSI) $5a$ to $5d$, respectively to detect their electric field strengths. These electric field strength signals detected by RSSI are supplied to the operational amplifiers $4a$ to $4d$. The operational amplifiers $4a$ to $4d$ multiply the intermediate-frequency signals by the electric field strength signals.

In the operational amplifiers $4a$ to $4d$, the intermediate-frequency signals are weighted based on the RSSI detected signals. The weighted four intermediate-frequency signals are combined together into one combined intermediate-frequency signal in an addition circuit 6, and this signal is sent to a demodulation circuit 7 and demodulated therein.

Since, in the foregoing conventional system, the frequency converters $2a$ to $2d$ and the RSSIs $5a$ to $5d$ differ in processing time from each other, the RSSI signals output from the RSSIs $5a$ to $5d$ and the intermediate-frequency signals output from the frequency converters $2a$ to $2d$ differ in input timing to the operational amplifier $4a$ to $4d$ from each other. Consequently, in the operational amplifiers $4a$ to $4d$, the intermediate-frequency signals are weighted by the RSSI detected signals in different timing. In other words, the intermediate-frequency signals cannot be weighted in accordance with the RSSI signals corresponding to the portions thereof. The conventional system has a drawback in which the intermediate-frequency signals output from the frequency converters $2a$ to $2d$ cannot be weighted appropriately thereby to cause a demodulation error and lower communication quality.

BREIF SUMMARY OF THE INVENTION

The present invention has been developed in consideration of the above situation, and its object is to provide a radio communications apparatus with a combining diversity which can be improved in communication quality by properly weighting received signals.

According to a first aspect of the present invention, there is provided a radio communications apparatus comprising:

a plurality of reception means for receiving a radio signal transmitted from a transmitter;

a plurality of conversion means for converting radio signals received by the plurality of reception means into first signals having a frequency which is lower than that of the radio signals;

a plurality of demodulation means for demodulating the first signals generated by the plurality of conversion means into baseband signals;

a plurality of detection means for detecting quality of the radio signals received by the plurality of reception means;

weight coefficient generation means for generating weight coefficients to weight the baseband signals based on the quality detected by the plurality of detection means;

delay means for delaying input of the quality to the weight coefficient generation means by a predetermined period of time;

a plurality of weighting means for weighting the baseband signals by the weight coefficients generated by the weight coefficient generation means; and combining means for combining the baseband signals weighted by the plurality of weighting means.

In the radio communications apparatus so constituted, the baseband signals are weighted by the weighting means using the weight coefficients generated by the weight coefficient generation means. Since the radio signals received by the reception means can be converted into the baseband signals and then weighted, weighting can be performed with respect to accurate received signal portions.

According to a second aspect of the present invention, there is provided a radio communications apparatus comprising:

a plurality of reception means for receiving a radio signal transmitted from a transmitter;

a plurality of conversion means for converting radio signals received by the plurality of reception means into baseband signals;

a plurality of detection means for detecting quality of the radio signals received by the plurality of reception means;

weight coefficient generation means for generating weight coefficients for weighting the baseband signals based on the quality detected by the plurality of detection means;

delay means for delaying input of the quality to the weight coefficient generation means by a predetermined period of time;

a plurality of weighting means for weighting the baseband signals by the weight coefficients generated by the weight coefficient generation means;

combining means for combining the baseband signals weighted by the plurality of weighting means; and demodulation means for demodulating the combined baseband signal generated by the combining means.

In the radio communications apparatus so constituted, the conversion means converts radio signals directly into baseband signals, and weighting is performed for these baseband signals. Therefore, weighting is performed with respect to the accurate radio signal portion, resulting in improvement of the communication quality.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 is a block diagram showing a weight coefficient generation circuit of the apparatus shown in FIG. 5.

DETAILED DESCRIPTION OF THE INVENTION (First Embodiment)

Figure 1:
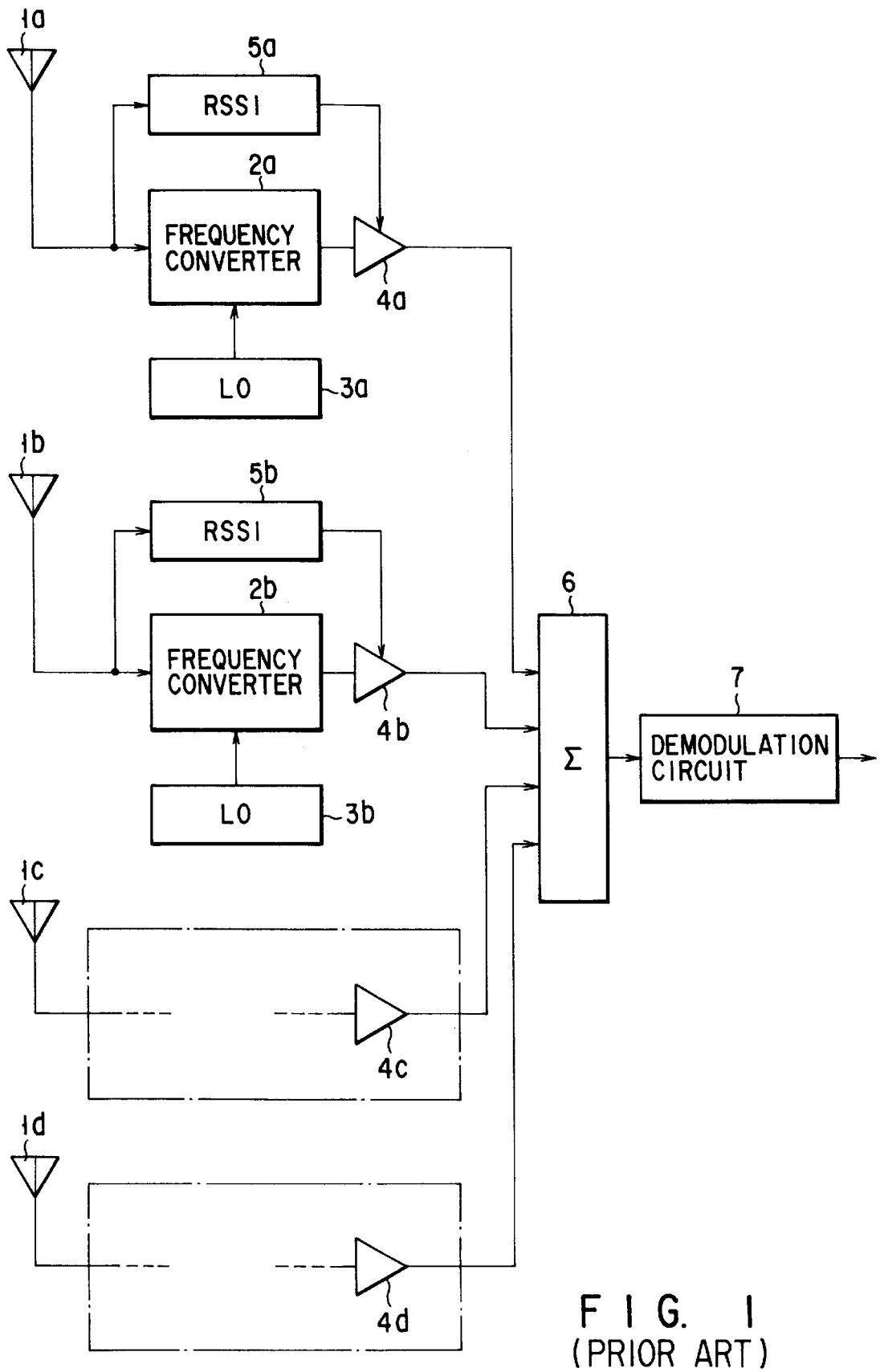
FIG. 1 is a block diagram of the arrangement of a radio circuit section of a prior art PHS base station.
Figure 2:
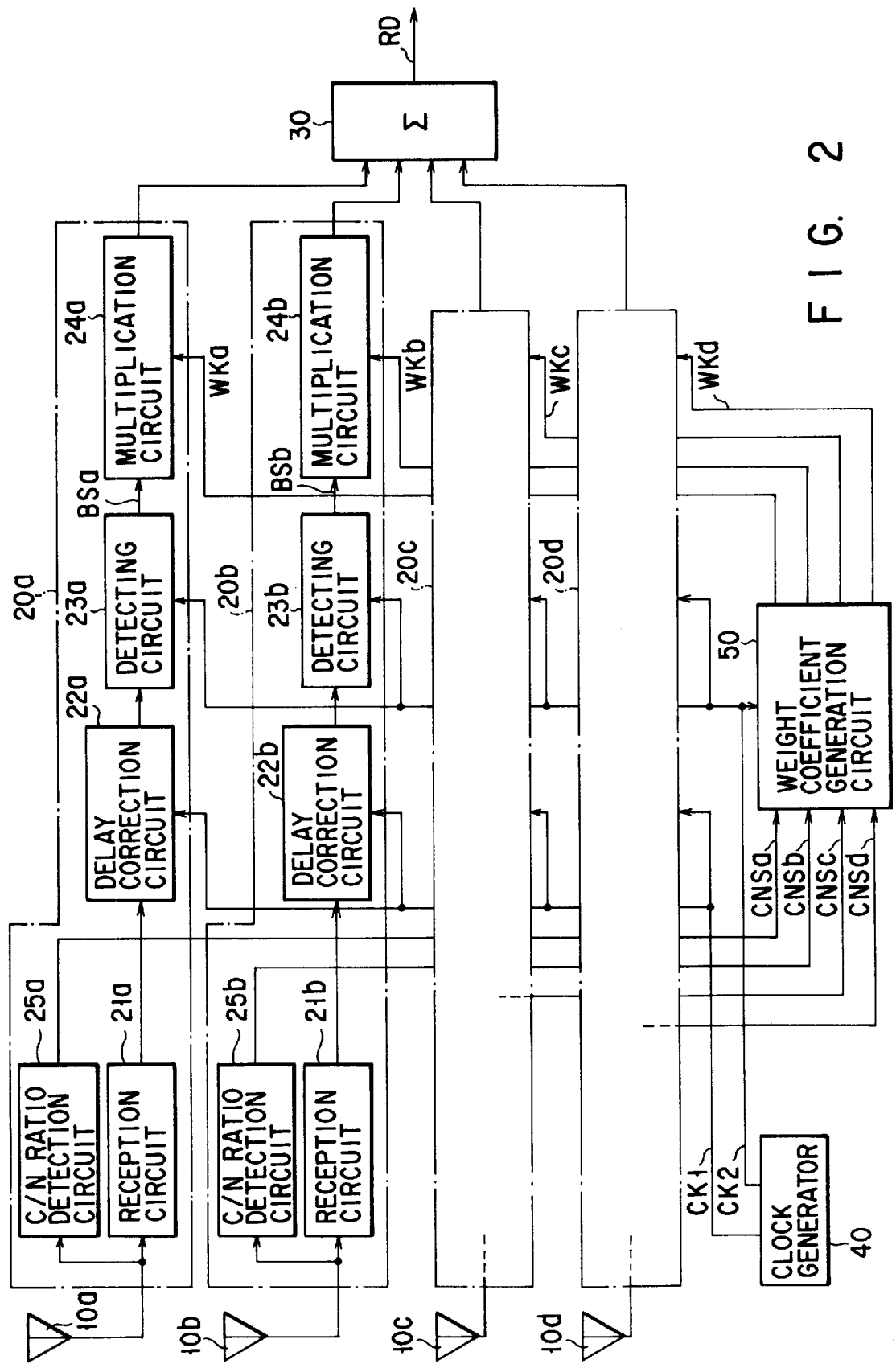
FIG. 2 is a block diagram showing the main part of a radio communications apparatus according to a first embodiment of the present invention.

FIG. 2 is a block diagram showing a main part of a radio communications apparatus according to a first embodiment of the present invention.

The radio communications apparatus comprises four antennas 10a to 10d arranged at regular intervals, four received-signal demodulation sections 20a to 20d corresponding to the antennas 10a to 10d, a digital addition circuit 30, a clock generator 40, and a weight coefficient generation circuit 50.

The demodulation sections 20a to 20d include reception circuits 21a to 21d, delay correction circuits 22a to 22d, detecting circuits 23a to 23d, multiplication circuits 24a to 24d and C/N ratio detection circuits 25a to 25d, respectively.

The reception circuits 21a to 21d amplify high-frequency elements in the radio signals, received by the antennas 10a to 10d, and then down-convert them to intermediate-frequency signals (IF signals), respectively. The IF signals are converted to digital signals by an analog-to-digital converters (hereinafter referred to as A/D converters).

The delay correction circuits 22a to 22d serve to absorb irregularities in signal delay caused from the antennas 10a to 10d to the reception circuits 21a to 21d. The digital signals output from the reception circuits 21a to 21d are delayed by an amount of predetermined correction delay corresponding to the signal delay in synchronization with a reference clock CK1 generated from a clock generator 40.

The detecting circuits 23a to 23d digitally demodulate the digital signals, output from the delay correction circuits 22a to 22d, in accordance with a predetermined digital modulation/demodulation method and output digitally demodulated baseband signals BSa to BSd in synchronization with a clock CK2 generated from the clock generator 40. The period of the clock CK2 is set to a one-symbol period of the digitally demodulated baseband signals BSa to BSd. For example, π/4 QPSK method is used as the digital modulation/demodulation method.

The multiplication circuits 24a to 24d multiply the digitally demodulated baseband signals BSa to BSd output from the detecting circuits 23a to 23d by weight coefficients WKa to WKd output from the weight coefficient generation circuit 50 which will be described later. The weighted, digitally demodulated signals are sent to the digital addition circuit 30. The digital addition circuit 30 adds the weighted, digitally demodulated signals together and supplies an added, digitally demodulated signal RD to a signal processing circuit (not shown) such as a TDMA circuit or a CODEC.

The C/N ratio detection circuits 25a to 25d detect carrier-to-noise power ratio (referred to as C/N hereinafter) in the radio signals received by the antennas 10a to 10d. The detected ratios are converted into digital signals by the A/D converters, and the digital signals are supplied to the weight coefficient generation circuit 50 as C/N ratio detection signals CNSa to CNSd.

The weight coefficient generation circuit 50 generates the weight coefficients WKa to WKd corresponding to digitally, demodulated baseband signals BSa to BSd based on the C/N ratio detection signals CNSa to CNSd.

Figure 3:
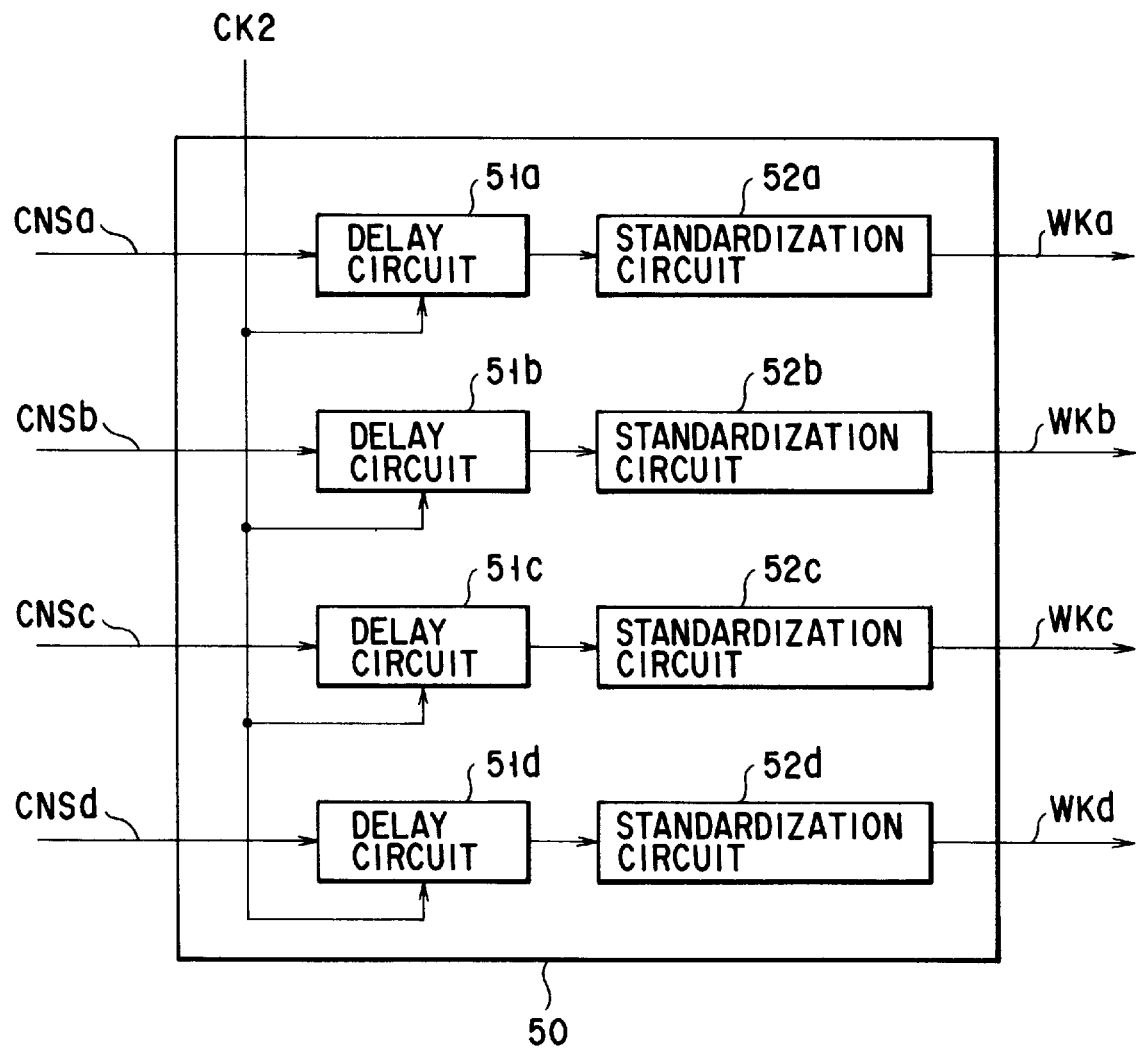
FIG. 3 is a block diagram showing a weight coefficient generation circuit of the apparatus shown in FIG. 2.

FIG. 3 is a block diagram showing the weight coefficient generation circuit 50. This circuit 50 includes four pairs of circuits corresponding to four series of digitally demodulated signals. The four pairs of circuits each have a delay circuit and a standardization circuit.

The delay circuits 51a to 51d delay the C/N ratio detection signals CNSa to CNSd by a predetermined amount in synchronization with a clock CK2 generated from the clock generator 40. The amount of delay is determined so as to erase a difference between processing delay time required from when the digital intermediate frequency signals are output from the reception circuit 21a to 21d until they are supplied to the detecting circuits 23a to 23d through the delay correction circuits 22a to 22d and demodulated into digital demodulation baseband signals BSa to BSd and processing delay time required from when the C/N ratio detection signals CNSa to CNSd are output from the C/N ratio detection circuits 25a to 25d until the weight coefficients WKa to WKd are generated based on the signals CNSa to CNSd.

Whenever the standardization circuits 52a to 52d are supplied with the C/N ratio detection signals CNSa to CNSd corresponding to one symbol from the delay circuits 51a to 51d, they perform an operation to calculate the weight coefficients WKa to WKd in accordance with predetermined algorithm based on the detected signals. The calculated weight coefficients are sent to the multiplication circuits 24a to 24d. In this operation, the weight coefficients WKa to WKd are standardized such that the total sum of these coefficients always has a predetermined value.

An operation of the radio communications apparatus so constituted, will now be described.

Radio signal transmitted from a PHS mobile station (not shown) is received by four antennas 10a to 10d. The received signals are down-converted to intermediate-frequency signals by the reception circuits 21a to 21d. These signals are digitized and supplied to the delay correction circuits 22a to 22d. In the delay correction circuits 22a to 22d, the digitized intermediate-frequency signals are delayed by a predetermined amount thereby to erase a difference in phase among the series, caused in the reception circuits 21a to 21d.

The digitized intermediate-frequency signals, the phase difference among which is corrected, are input to the detecting circuits 23a to 23d. The circuits 23a to 23d digitally demodulate the intermediate-frequency signals into digitally demodulated baseband signals BSa to BSd. These signals BSa to BSd are supplied to the multiplication circuits 24a to 24d for each symbol in synchronization with the symbol clock CK2 generated from the clock generator 40. In the first embodiment, the digitally demodulated baseband signals BSa to BSd have a frequency of about 384 kHz.

On the other hand, the C/N of a received radio signal is detected in each of the C/N ratio detection circuits 25a to 25d in parallel with the foregoing received signal demodulation operation, and a detected signal is digitized and supplied to the weight coefficient generation circuits 50.

In the weight coefficient generation circuit 50, the delay circuits 51a to 51d delay the digitized C/N ratio detected signals CNSa to CNSd supplied from the C/N ratio detection circuits 25a to 25d by a predetermined amount. This delay operation absorbs a difference between the processing delay time required from when the digital intermediate frequency signals are output from the reception circuit 21a to 21d until they are supplied to the detecting circuits 23a to 23d through the delay correction circuits 22a to 22d and demodulated into digitally demodulated baseband signals BSa to BSd and processing delay time required from when the C/N ratio detected signals CNSa to CNSd are output from the C/N ratio detection circuits 25a to 25d until the weight coefficients WKa to WKd are generated based on the signals CNSa to CNSd. For this reason, the input timing of the digitally demodulated baseband signals BSa to BSd input to the multiplication circuits 24a to 24d coincident to that of the weight coefficients WKa to WKd.

Therefore, even when a delay in processing occurs in the detecting circuits 23a to 23d, it can be absorbed to always weight each symbol of the demodulated baseband signals in exact timing, with the result that combining diversity reception can be performed with higher precision.

The standardization circuits 52a to 52d perform an operation according to predetermined algorithm on the basis of the digitized C/N ratio detected signals to obtain the weight coefficients WKa to WKd. An example of the algorithm will be described. For simple descriptions, two weight coefficient WKa and WKb are selected as examples in this embodiment.

Assume that the following are outputted as the digitized C/N ratio detected signals:

$$\Delta RSSIa = x dB\mu V$$

$$\Delta RSSIb = y dB\mu V$$

In x>y in the above equations, the following are obtained:

$$W'a = \Delta RSSIa - \Delta RSSIa = x - x = 0 \text{ dB}$$

$$W'b = \Delta RSSIa - \Delta RSSIb = x - y = z dB$$

If the weight coefficient W'a1 of 0 dB is 1, the value of W'b1 can be calculated on the basis of the logarithm ratio of voltage or power, and the following equations are obtained:

$$W'a1 = 1 \quad (1)$$

$$W'b1 = Z' \quad (2)$$

The standardized weight coefficients WKa and WKb can thus be calculated from the above equations (1) and (2), as follows:

$$WKa = W'a1/(W'a1 + W'b1) = 1/(1+z')$$

$$WKb = W'b1/(W'a1 + W'b1) = z'/(1+z')$$

That is, WKa+WKb=1, and the total sum of the coefficients are standardized so as to have a constant value.

Figure 4:
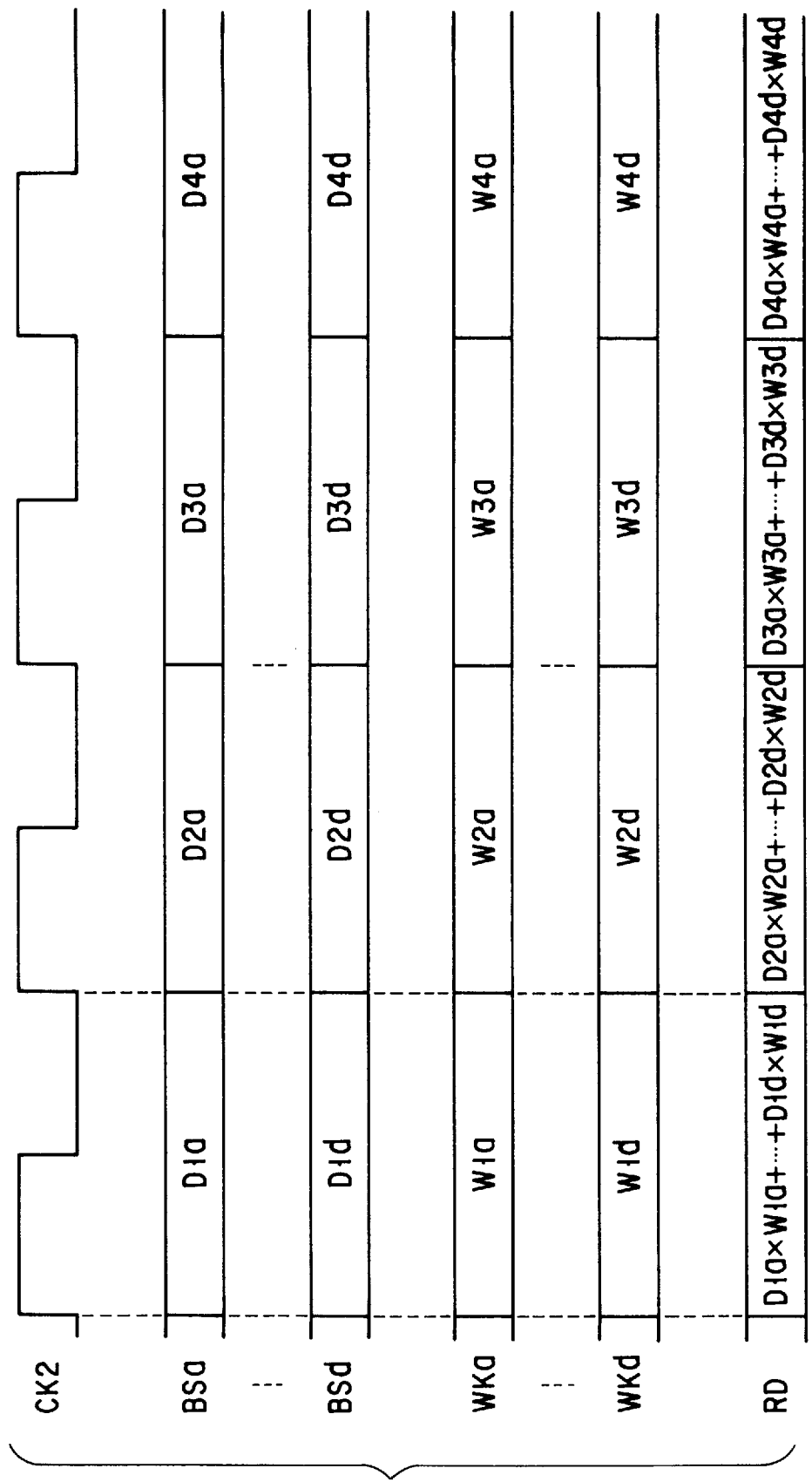
FIG. 4 is a timing chart showing an operation of the apparatus shown in FIG. 2.

The multiplication circuits 24a to 24d multiply the demodulated baseband signals BSa to BSd by the weight coefficients WKa to WKd for each symbol, as shown in FIG. 4, and the weighted, digital demodulation signals are output. The digital demodulation signals are added together by the digital addition circuit 30, and a digital demodulation signal RD corresponding to the added digital demodulation signals.

In the foregoing embodiment, the delays of the digital intermediate-frequency signals output from the reception circuits 21a to 21d are corrected by the delay correction circuits 22a to 22d and demodulated by the detecting circuits 23a to 23d. The demodulated baseband signals BSa to BSd so obtained are input to the weighting multiplication circuits 24a to 24d. In these circuits 24a to 24d, the demodulated signals BSa to BSd are multiplied by the weight coefficients WKa to WKd generated from the weight coefficient generation circuit 50 based on the C/N ratio detected signals CNSa to CNSd, and the weighted demodulation signals are added together by the addition circuit 30.

According to the first embodiment described above, the delay correction circuits 22a to 22d are provided on the preceding stage of the detecting circuits 23a to 23d to absorb a difference in phase among the series which is caused by irregularities in signals of the reception circuits 21a to 21d and make the phases of the intermediate-frequency signals input to the detecting circuits 23a to 23d coincident to each other.

An operation of weighting the demodulation baseband signals BSa to BSd is performed for each symbol in the multiplication circuits 24a to 24d on the baseband stage. Thus, the power consumption required therefore can be made lower than that required for an operation of weighting the intermediate-frequency signals.

Since, in the first embodiment, the weighting operation is carried out on the baseband stage, if some of all the antennas are selectively used to perform combining diversity reception, the baseband signal level of the other antennas not used, i.e., the noise level thereof can be set to approximately zero. It is thus possible to increase the S/N (signal-to-noise) ratio of the weighted, added signals. Consequently, the C/N signals can be detected regarding to the received signal from one of the plural antennas and, when the reception levels of the other antennas are lower than the detected level and thus cannot be detected, they can be set to zero by weighting.

In contrast, when the weighting and combining operation is performed on the intermediate-frequency stage, the noise level does not become zero since a receiver noise is inserted in the signal series of the unused antennas. Thus, the S/N ratio is inevitably decreased.

Furthermore, in the first embodiment, the weight coefficient generation circuit 50 is provided with the delay circuits 51a to 51d for delaying the C/N ratio detected signals CNSa to CNSd by a predetermined amount. The timing in which the weight coefficients WKa to WKd are input to the multiplication circuits 24a to 24d can be made coincident with the input timing of the digital demodulation baseband signals, thereby absorbing a difference between a signal delay caused in the process of demodulation and that caused in the process of generation of the weight coefficients. The weighting operation can thus be always correctly performed.

Assuming that a signal delay corresponding to 3.5 symbols occurs between the input and output of each of the detecting circuits 23a to 23d, the position of a symbol to be weighted will be shifted by 3.5 symbols if the signal delay is not taken into consideration, and the exact weighting operation cannot be executed, causing an error in determining the detected signals. In contrast, if, as in the first embodiment, the output timing of the weight coefficients WKa to WKd is delayed in view of the delay for 3.5 symbols, the input timing of the demodulated baseband signals BSa to BSd to the multiplication circuits 24a to 24d and that of the weight coefficients WKa to WKd can be made coincident with each other, with the result that a correct weighting operation can always be performed.

According to the first embodiment, the weighting coefficient generation circuit 50 is provided with the standardization circuits 52a to 52d to generate weight coefficients WKa to WKd which are standardized such that the total sum of the weight coefficients WKa to WKd has a preset constant value. Therefore, no overflow occurs in the multiplication of the multiplication circuits 24a to 24d and accordingly an operation can be performed with fewer errors.

Moreover, according to the first embodiment, the C/N ratio detection circuits 25a to 25d detect C/N ratios of radio signals received by the antennas 10a to 10d, and the weight coefficient generation circuit 50 generate weight coefficients WKa to WKd based on the detected C/N ratios. Not only variations in electric field strength but also variations in phase can be detected as the quality of received signals and, in this case, the weight coefficients can be calculated more appropriately than those in the case where they are generated based on only the detected electric field strength.

(Second Embodiment)

The second embodiment is directed to a radio communications apparatus wherein a heterodyne direct conversion system for directly frequency-converting a radio signal into a baseband signal is employed in a reception circuit. In this apparatus, the baseband signals output from the reception circuit are weighted, the weighted baseband signals are added together, and the added signals are demodulated in a detecting circuit.

Figure 5:
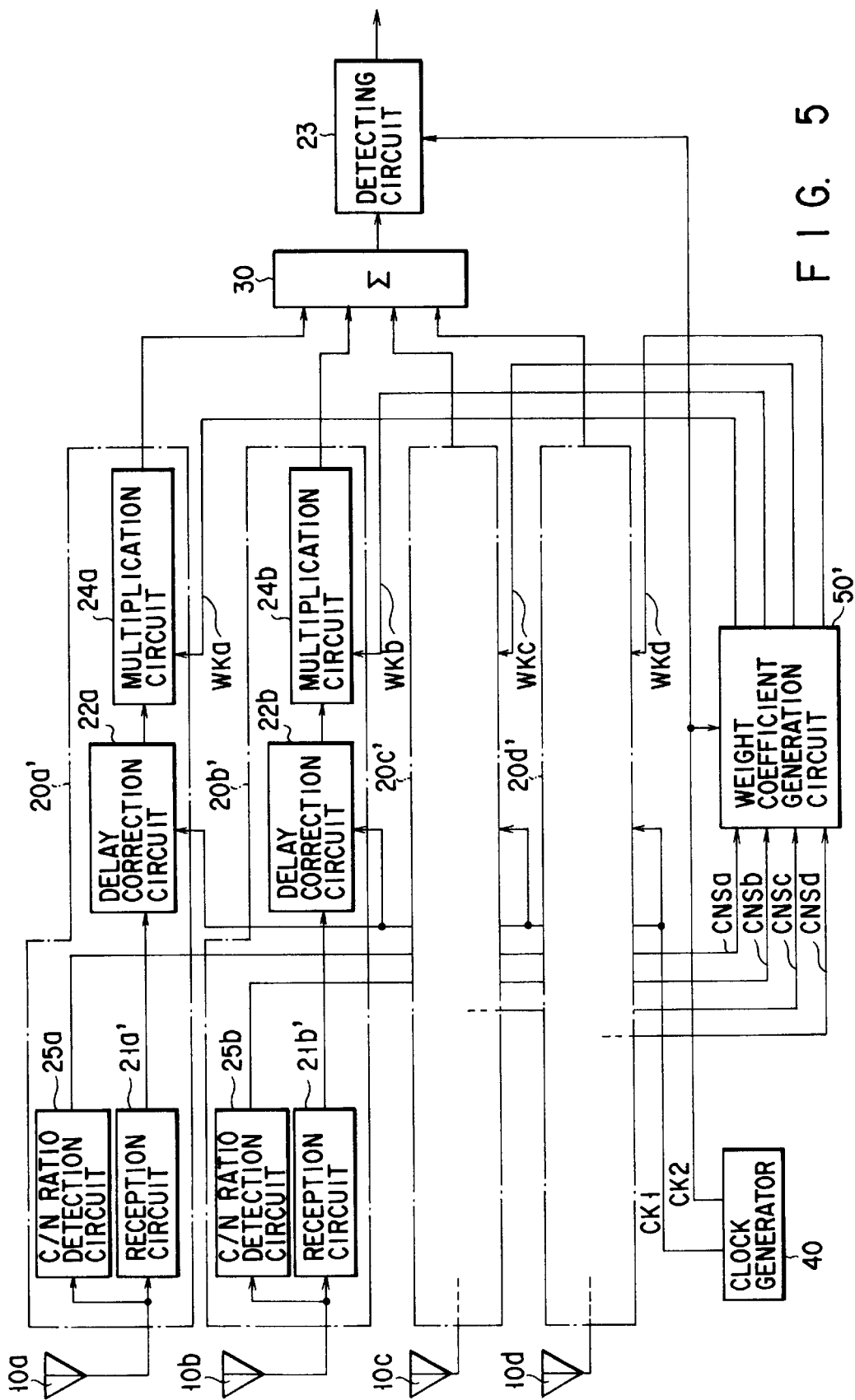
FIG. 5 is a block diagram showing the main part of a radio communications apparatus according to a second embodiment of the present invention.

FIG. 5 is a block diagram showing a main part of a radio communications apparatus according to a second embodiment of the present invention. In FIG. 5, the same elements as those of FIG. 2 are indicated by the same reference numerals, and their detailed descriptions are omitted.

The radio signals, received by four antennas 10a to 10d, are supplied to their corresponding receiving sections 20a' to 20d'. In the receiving sections 20a' to 20d', the radio signals are frequency-converted into digital baseband signals by reception circuits 21a' to 21d', then a phase difference among the signals is corrected by delay correction circuits 22a to 22d, and the resultant signals are input to multiplication circuits 24a to 24d for weighting. In other words, the radio signals received by the reception circuits 21a' to 21d', are simultaneously supplied to the multiplication circuits 24a to 24d.

C/N ratio detection circuits 25a to 25d detect ratios of carrier-to-noise power (referred to as C/N ratios hereinafter) in the radio signals received by the antennas 10a to 10d. The detected ratios are converted into digital signals by A/D converters, and the digital signals are supplied to a weight coefficient generation circuit 50 as C/N ratio detection signals CNSa to CNSd.

The weight coefficient generation circuit 50' generates weight coefficients WKa to WKd, which are used for weighting the digital baseband signals, on the basis of the C/N ratio detection signals CNSa to CNSd output from the C/N ratio detection circuits 25a to 25d.

FIG. 6 is a block diagram showing the weight coefficient generation circuit 50'. This circuit 50' includes four pairs of circuits corresponding to four series of digital baseband signals. The four pairs of circuits each have a delay circuit and a standardization circuit.

Delay circuits 51a' to 51d' delay the C/N ratio detection signals CNSa to CNSd by a predetermined amount in synchronization with a clock CK2 generated from a clock generator 40. The amount of delay is determined so as to erase a difference between processing delay time required from when the digital baseband signals are outputted from the reception circuit 21a' to 21d' until they are supplied to the multiplication circuits 24a to 24d through the delay correction circuits 22a to 22d and processing delay time required from when the C/N ratio detection signals CNSa to CNSd are outputted from the C/N ratio detection circuits 25a to 25d until the weight coefficients WKa to WKd are generated based on the signals CNSa to CNSd.

Whenever the standardization circuits 52a' to 52d' are supplied with the C/N ratio detection signals CNSa to CNSd corresponding to one symbol through the delay circuits 51a' to 51d', they perform an operation to calculate the weight coefficients WKa to WKd in accordance with predetermined algorithm based on the C/N ratio detection signals CNSa to CNSd, as in the first embodiment described above. The calculated weight coefficients WKa to WKd are sent to the multiplication circuits 24a to 24d. In this operation, the weight coefficients WKa to WKd are standardized such that the total sum of these four series of coefficients always has a predetermined value.

The multiplication circuits 24a to 24d multiply the digital baseband signals which are outputted from the delay correction circuits 22a to 22d, by the weight coefficients WKa to WKd output from the weight coefficient generation circuit 50'. The weighted, digital baseband signals are inputted to a digital addition circuit 30 and added together therein. The added signal is supplied to a detecting circuit 23 to be demodulated into a digital demodulation signal. The demodulation signal is then supplied to a signal processing circuit such as a TDMA circuit or a CODEC (neither of which is shown).

According to the signal combining diversity radio communications apparatus of the second embodiment, since the received signals can be weighted appropriately by controlling the weighting timing of the received signals by the delay correction circuits 22a to 22d and the delay circuits 51'a to 51'd, the quality of communication can be improved.

Since one-series weighted and added digital reception signal is input to the detecting circuit and demodulated, the number of detecting circuits can be one and accordingly the circuit arrangement can be compact.

Since, furthermore, an operation for weighting is carried out in the multiplication circuits 24a to 24d prior to demodulation, the delay (corresponding to 3.5 symbols) of digital reception signals due to the demodulation need not be taken into consideration. However, the delay by direct conversion of radio signals has to be considered.

The present invention is not limited to the above first and second embodiments. For example, in the embodiments, the demodulation of reception signals, generation of weight coefficients, multiplication for weighting, addition, and delay processing of delay correction circuits 22a to 22d and delay circuits 51a to 51d, are performed digitally. However, they can be done by an analog circuit.

In the first and second embodiments, the delay amounts are predetermined in the delay correction circuits 22a to 22d and delay circuits 51a to 51d. The delay amounts can be varied in these circuits 22a to 22d and 51a to 51d by causing a synchronization circuit or the like to monitor a phase difference among the received signals of the respective series and an amount of delay in the demodulation processing. It is thus possible to exactly control a delay even when the circuit characteristics are varied with temperature, ages, etc.

In the first embodiment, the weight coefficient generation circuit 50 is provided with the delay circuits 51a to 51d for making the input timing of digital demodulation baseband signals BSa to BSd to the multiplication circuits 24a to 24d and that of weight coefficients WKa to WKd coincident with each other. However, delay circuits having the same function as that of the circuits 51a to 51d can be interposed between the standardization circuits 52a to 52d and the multiplication circuits 24a to 24d or between the C/N ratio detection circuits 25a to 25d and the weight coefficient generation circuit 50.

In the second embodiment, the direct conversion system is employed in the reception circuits. The present invention can be applied to a reception circuit using a heterodyne direct conversion system, a superheterodyne conversion system, or a double superheterodyne conversion system. More specifically, even when a reception circuit of such a system is used, the digital reception signal whose frequency is down-converted to the baseband frequency is input to the multiplication circuits 24a to 24d and weighted, and output signals of the circuits 24a to 24d are added together and supplied to the detecting circuit 23.

The present invention is not limited to the PHS base station, but can be applied to any radio communications apparatus if a signal combining diversity reception system can be applied to the apparatus, various changes and modifications can be made to the number of antennas, the constitutions of the reception and demodulation section, the weighting control section, the weighting operation section, etc. without departing from the scope of the subject matter of the present invention.

As described above in detail, according to the present invention, the input timing of the weight coefficients to the multiplication circuits and that of the baseband signals can be made coincident with each other to always correctly weight the digital reception signals. As a result, a demodulation operation can be performed with high precision, thereby reducing an error in demodulation and improving in communication quality.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A radio communications apparatus comprising:

a plurality of reception means for receiving a radio signal transmitted from a transmitter;

a plurality of conversion means for converting radio signals received by said plurality of reception means into first signals having a frequency which is lower than that of the radio signals;

a plurality of demodulation means for demodulating the first signals generated by said plurality of conversion means into baseband signals;

a plurality of detection means for detecting quality of the radio signals received by said plurality of reception means;

weight coefficient generation means for generating weight coefficients to weight the baseband signals based on the quality detected by said plurality of detection means;

delay means for delaying input of the quality to the weight coefficient generation means by a predetermined period of time;

a plurality of weighting means for weighting the baseband signals by the weight coefficients generated by said weight coefficient generation means; and combining means for combining the baseband signals weighted by said plurality of weighting means.

2. The apparatus according to claim 1, further comprising a plurality of first control means, arranged between said plurality of conversion means and said plurality of demodulation means, for inputting the baseband signals from said plurality of conversion means to said plurality of demodulation means substantially at once.

3. The apparatus according to claim 1, wherein said baseband signals are digital signals.

4. The apparatus according to claim 1, wherein said quality detected by said plurality of detection means, is a carrier-to-noise power ratio.

5. The apparatus according to claim 1, wherein a total sum of the weight coefficients generated by said weight coefficient generation means is a constant.

6. The apparatus according to claim 1, wherein said detection means detects the quality at a speed at which said detection means can detect each symbol successively.

7. A radio communications apparatus comprising:

a plurality of reception means for receiving a radio signal transmitted from a transmitter;

a plurality of conversion means for converting radio signals received by said plurality of reception means into baseband signals;

a plurality of detection means for detecting quality of the radio signals received by said plurality of reception means;

weight coefficient generation means for generating weight coefficients for weighting the baseband signals based on the quality detected by said plurality of detection means;

delay means for delaying input of the quality to the weight coefficient generation means by a predetermined period of time so as to adjust a difference between a first processing delay time for generating the baseband signals and a second processing delay time for generating the weighted coefficients;

a plurality of weighting means for weighting the baseband signals by the weight coefficients generated by said weight coefficient generation means;

combining means for combining the baseband signals weighted by said plurality of weighting means; and demodulation means for demodulating the combined baseband signal generated by said combining means.

8. The apparatus according to claim 7, further comprising a plurality of first control means, arranged between said plurality of conversion means and said plurality of weighting means, for inputting the baseband signals from said plurality of conversion means to said plurality of weighting means substantially at once.

9. The apparatus according to claim 7, wherein said baseband signals are digital signals.

10. The apparatus according to claim 7, wherein said quality detected by said plurality of detection means is a carrier-to-noise power ratio.

11. The apparatus according to claim 7, wherein a total sum of the weight coefficients generated by said weight coefficient generation means is a constant.

12. The apparatus according to claim 7, wherein said detection means detect the quality at a speed at which said detection means can detect each symbol successively.

13. A radio communications apparatus comprising:

a plurality of reception means for receiving a radio signal transmitted from a transmitter;

a plurality of conversion means for converting radio signals received by said plurality of reception means into baseband signals;

generation means, for detecting reception quality of the radio signals received by said plurality of reception means and for generating weight coefficients based on the detected reception quality of the radio signals;

a plurality of weighting means for receiving the baseband signals and the weight coefficients and weighting the baseband signals based on the weight coefficients;

timing adjusting means for adjusting input timings of the baseband signals and the weight coefficients to said plurality of weighting means to each other so as to adjust a difference between a first processing delay time for generating the baseband signals and a second processing delay time for generating the weight coefficients; and combining means for combining the baseband signals weighted by said plurality of weighting means.

14. The apparatus according to claim 13, wherein said timing adjusting means includes delay means for delaying input of the weight coefficients to said plurality of weighting means.

15. The apparatus according to claim 13, wherein the timing adjusting means makes phases of the radio signals input to said plurality of weighting means coincident with each other.

16. The apparatus according to claim 13, wherein said generation means includes detecting means for detecting said reception quality of said radio signals and weight coefficients generating means for generating weight coefficients based on the each detected reception quality, and said timing adjusting means for receiving said reception quality and delaying input of said quality to the weight coefficients generation means.

17. The apparatus according to claim 13, wherein said generation means detects the quality of each symbol of the Radio signal, and said weighting means weights each symbol.

18. The apparatus according to claim 13, wherein said conversion means directly frequency-converts said radio signal into said baseband signal.

19. The apparatus according to claim 13, wherein said reception quality is a carrier-to-noise power ratio.

* * * * *